US008923039B2

(12) United States Patent
Annunziata et al.

(10) Patent No.: US 8,923,039 B2
(45) Date of Patent: Dec. 30, 2014

(54) MULTIPLE BIT NONVOLATILE MEMORY BASED ON CURRENT INDUCED DOMAIN WALL MOTION IN A NANOWIRE MAGNETIC TUNNEL JUNCTION

(71) Applicant: International Business Machines Corporation, Armonk, NY (US)

(72) Inventors: Anthony J. Annunziata, Stamford, CT (US); Michael C. Gaidis, Wappingers Falls, NY (US); William Gallagher, Ardsley, NY (US); Luc Thomas, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 128 days.

(21) Appl. No.: 13/670,064

(22) Filed: Nov. 6, 2012

(65) Prior Publication Data

US 2014/0126280 A1 May 8, 2014

(51) Int. Cl.
G11C 11/00 (2006.01)

(52) U.S. Cl.
USPC .............................. 365/158; 365/148; 977/762

(58) Field of Classification Search
USPC .................................. 365/148, 158; 977/762
See application file for complete search history.

(56) References Cited

U.S. PATENT DOCUMENTS

| 7,710,769 | B2 | 5/2010 | Cowburn et al. |
| 7,710,770 | B2 | 5/2010 | Cowburn et al. |
| 7,898,844 | B2 | 3/2011 | Wang et al. |
| 8,009,453 | B2 | 8/2011 | Gaidis et al. |
| 8,023,305 | B2 | 9/2011 | Gaidis et al. |
| 2004/0021539 | A1* | 2/2004 | Bland et al. ................... 335/302 |
| 2005/0094427 | A1 | 5/2005 | Parkin |
| 2006/0221677 | A1* | 10/2006 | Klaeui et al. .................. 365/158 |
| 2007/0014151 | A1* | 1/2007 | Zhang et al. ............. 365/185.01 |
| 2007/0217256 | A1* | 9/2007 | Ono ............................. 365/171 |
| 2008/0278998 | A1* | 11/2008 | Cowburn et al. .............. 365/171 |
| 2010/0128510 | A1 | 5/2010 | Cowburn |

(Continued)

FOREIGN PATENT DOCUMENTS

| JP | 2010528455 A | 8/2010 |
| WO | 2010125181 A1 | 4/2012 |

OTHER PUBLICATIONS

A. Chanthbouala et al., "Vertical-current-induced domain-wall motion in MgO-based magnetic tunnel junctions with low current densities," Nature Physics, Letters published online: Apr. 10, 2011; vol. 7 Aug. 2011; www.nature.com/naturephysics; 5 pages.

(Continued)

*Primary Examiner* — Hoai V Ho
(74) *Attorney, Agent, or Firm* — Cantor Colburn LLP; Vazken Alexanian (57) ABSTRACT

A mechanism is provided for storing multiple bits in a domain wall nanowire magnetic junction device. The multiple bits are encoded based on a resistance of the domain wall nanowire magnetic junction device using a single domain wall. The single domain wall is shifted to change the resistance of the domain wall nanowire magnetic junction device to encode a selected bit. The resistance is checked to ensure that it corresponds to a preselected resistance for the selected bit. Responsive to the resistance corresponding to the preselected resistance for the selected bit, the selected bit is stored. Responsive to the resistance not being the preselected resistance for the selected bit, the single domain wall is shifted until the resistance corresponds to the preselected resistance.

7 Claims, 7 Drawing Sheets

(56) References Cited

U.S. PATENT DOCUMENTS

| | | | |
|---|---|---|---|
| 2010/0284209 A1* | 11/2010 | Kim et al. | 365/80 |
| 2010/0328986 A1 | 12/2010 | Tsai et al. | |
| 2011/0116306 A1 | 5/2011 | Suzuki et al. | |
| 2011/0157967 A1 | 6/2011 | Suzuki et al. | |
| 2011/0163402 A1 | 7/2011 | Fukami et al. | |
| 2011/0188298 A1 | 8/2011 | Suzuki et al. | |
| 2012/0163069 A1* | 6/2012 | Grollier et al. | 365/158 |

OTHER PUBLICATIONS

Xiaobin Wang et al., "Spintronic Memristor Temperature Sensor" IEEE Electron Device Letters, vol. 31, No. 1, Jan. 2010, 3 pages.

Xiaobin Wang et al., "Spintronic Memristor Through Spin-Torque-Induced Magnetization Motion" IEEE Electron Device Letters, vol. 30, No. 3, Mar. 2009, 4 pages.

* cited by examiner

MULTIPLE BIT NONVOLATILE MEMORY BASED ON CURRENT INDUCED DOMAIN WALL MOTION IN A NANOWIRE MAGNETIC TUNNEL JUNCTION

BACKGROUND

The present invention relates generally to magnetic memory devices, and more specifically, to encoding multiple bits in a nanowire magnetic tunnel junction via domain wall motion.

Magnetoresistive random access memory (MRAM) is a non-volatile computer memory (NVRAM) technology. Unlike conventional RAM chip technologies, MRAM data is not stored as electric charge or current flows, but by magnetic storage elements. The elements are formed from two ferromagnetic plates, each of which can hold a magnetic field, separated by a thin insulating layer. One of the two plates is a reference magnet set to a particular polarity; the other plate's field can be changed to match that of an external field to store memory and is termed the "free magnet" or "free-layer". This configuration is known as a magnetic tunnel junction and is the simplest structure for a MRAM bit. A memory device is built from a grid of such "cells".

One method of reading is accomplished by measuring the electrical resistance of the cell. A particular cell is (typically) selected by powering an associated transistor which switches current from a supply line through the cell to ground. Due to the magnetic tunnel effect, the electrical resistance of the cell changes due to the orientation of the magnetization in the two plates. By measuring the resistance of any particular cell, the direction of magnetization of the writable plate (i.e., the free layer) can be determined.

SUMMARY

According to one embodiment, a method for storing multiple bits in a domain wall nanowire magnetic junction device is provided. The method includes encoding the multiple bits based on a resistance of the domain wall nanowire magnetic junction device using a single domain wall, shifting the single domain wall to change the resistance of the domain wall nanowire magnetic junction device to encode a selected bit, and checking to ensure that the resistance corresponds to preselected resistance for the selected bit. Also, the method includes storing the selected bit responsive to the resistance corresponding to the preselected resistance for the selected bit, and shifting the single domain wall until the resistance corresponds to the preselected resistance responsive to the resistance not being the preselected resistance for the selected bit.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

An embodiment describes a magnetic memory device that can store data in a nonvolatile manner. The magnetic memory device can encode multiple bits per cell based on the position of a domain wall located in one layer of a multi-layer nanowire that forms a magnetic tunnel junction.

Most nonvolatile integrated memory devices, whether based on magnetism or on other physical properties or structures, are limited to storing a single bit of data per cell; since a cell typically requires 1-3 (or more) transistors to operate, this limits the bit density of the memory device. Of the relatively few integrated memory devices that exhibit multiple bit storage per cell, the density in most cases is still only a few bits per transistor (at best), especially for dense, integrated memory that has reasonably short (sub-microsecond) read/write times. In one type of fast magnetic nonvolatile memory, commonly referred to as "racetrack" memory, many bits can be stored per cell. However, these memory devices have a relatively complicated, two-stage, shift-then-read operation that poses many magnetic materials, integration, and circuit design challenges. Among the specific challenges of racetrack memory are that the racetrack requires coherently controlling the motion of tens to hundreds of domain walls along the same nanowire racetrack and reading out each of the domains/domain walls individually with a localized sensor.

According to an embodiment, a solution is presented to address the problems of existing multi-bit nonvolatile memory, especially of racetrack memory. A new type of magnetic memory cell is utilized that stores multiple bits based on the position of a single, current-moveable domain wall in a narrow, high aspect ratio domain wall nanowire magnetic tunnel junction (DWnMTJ). The high aspect ratio means that the nanowire/nanostrip magnetic tunnel junction is much longer than it is wide. These DWnMTJ structures provide a robust system for medium/high speed, high bit density memory. The design of the memory device relaxes many material and fabrication requirements relative to traditional MRAM, racetrack, and other magnetic memory devices, which makes the DWnMTJ especially attractive. In particular, compared to racetrack memory, the DWnMTJ, having only one domain wall, enables using materials that are less homogeneous since variations in local pinning strength along the nanowire are not as important when there is only one domain wall versus several domain walls. Compared to traditional MRAM, the DWnMTJ is patterned as a line versus a dot/island, which is easier to pattern using standard lithographic processes used in semiconductor manufacturing.

Figure 1:
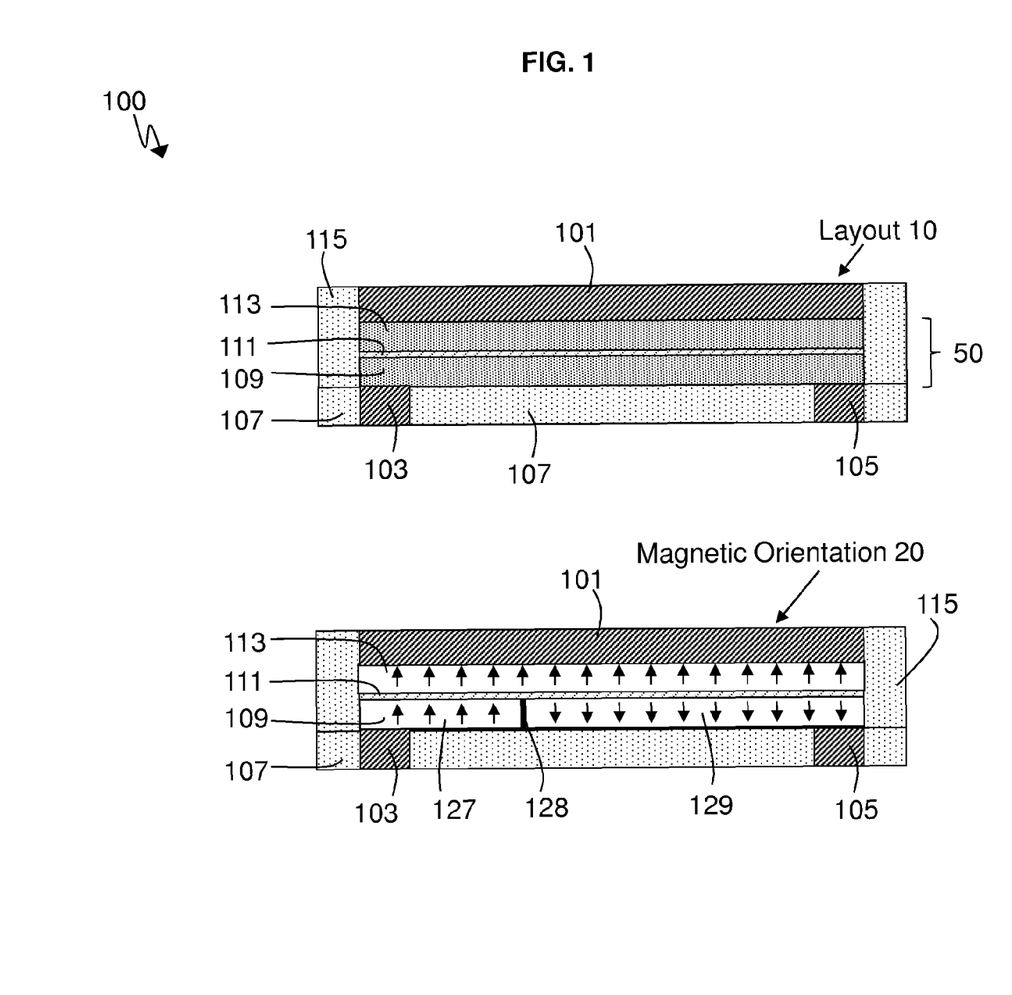
FIG. 1 is cross-sectional view of a domain wall nanowire magnetic tunnel junction (DWnMTJ) device according to an embodiment.

Turning now to the figures, FIG. 1 is a cross-sectional view of a domain wall nanowire magnetic tunnel junction (DWnMTJ) device 100 according to an embodiment. Reference is made to a layout view 10 and magnetic orientation view 20 of the domain wall nanowire magnetic tunnel junction (DWnMTJ) device 100, as shown in FIG. 1. The structure includes a top contact 101 and two bottom contacts 103 and 105 adjacent to and electrically connected to the device 100. The top contact 100, bottom contact 103, and bottom contact 105 are metal.

The domain wall nanowire magnetic tunnel junction (DWnMTJ) device 100 includes a magnetic tunnel junction 50. The magnetic tunnel junction 50 includes three layers, which are magnetic storage layer 109 also referred to as a free layer, a nonmagnetic tunnel barrier 111, and a magnetic reference layer 113. The nonmagnetic tunnel barrier 111 electrically separates the magnetic storage layer 109 and the magnetic reference layer 113. Note that the order of the layers can be reversed, i.e. the free layer may be either 109 or 111 and the reference layer may therefore be either 111 or 109, respectively.

The magnetic storage layer 109 has two domains 127 and 129 (e.g., left and right domains) of opposite magnetization and a single domain wall 128 separating the two domains 127 and 129, as seen in the magnetic orientation view 20. The magnetic reference layer 113 has a fixed magnetization that does not change. Insulating materials 107 and 115 encapsulate the magnetic tunnel junction 50.

Figure 5:
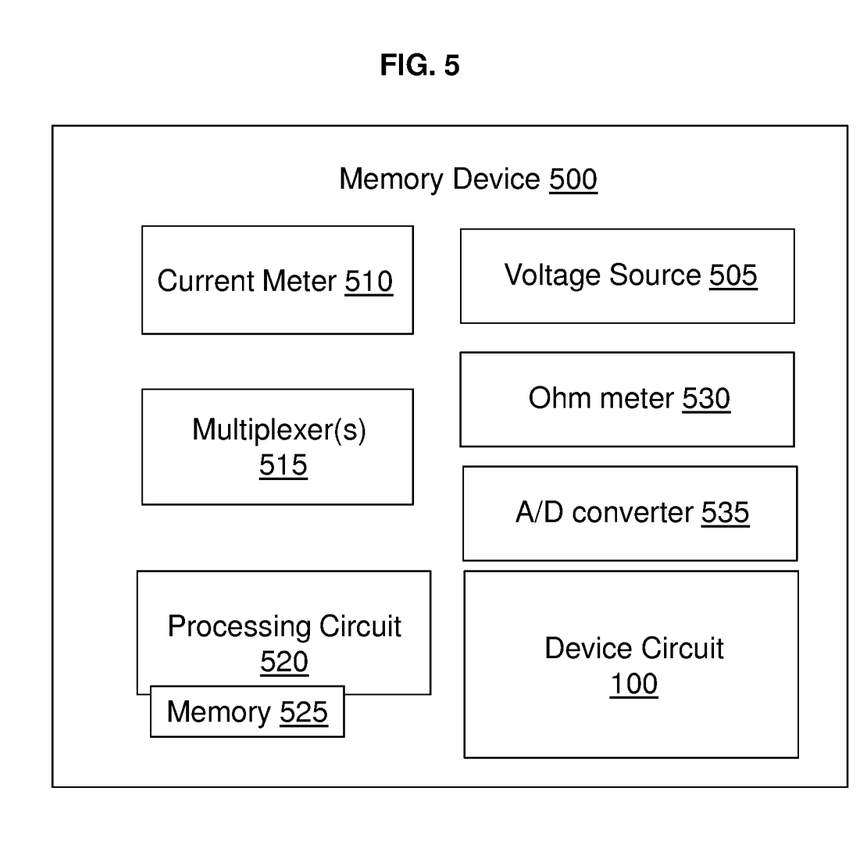
FIG. 5 illustrates a memory device which includes the circuit for an array of domain wall nanowire magnetic tunnel junction devices according to an embodiment.

The resistance of the magnetic tunnel junction 50 from the magnetic storage layer 109 to the magnetic reference layer 113 is measured via an ohm meter 530 (shown in FIG. 5). The resistance of the magnetic tunnel junction 50 may be measured from bottom contact 103 (and/or bottom contact 105) and top contact 101. The magnetic orientation of the domain 127 is pointing up as shown by the arrows while the magnetic orientation of the domain 129 is pointing down. The magnet orientation of the domain 127 is parallel to the magnetic orientation of the magnetic reference layer 113 (which also points up), and the magnetic orientation of the domain 129 is antiparallel to the magnetic reference layer 113. When electrical current is applied to the bottom contact 103 by a voltage source 505 (shown in FIG. 5) (i.e., positive side connected to the bottom contact 103 and negative side connected to the bottom contact 105), current flows into the bottom contact 103, through the magnetic storage layer 109 moving the single domain wall 128 to the right, and out through the bottom contact 105. When electrical current is applied to the bottom contact 105 by the voltage source 505 (i.e., positive side connected to the bottom contact 105 and negative side connected to the bottom contact 103), current flows into the bottom contact 105, through the magnetic storage layer 109 moving the single domain wall 128 to the left, and out through the bottom contact 103. The shifting of the single domain wall 128 to the right or left is controlled by the direction of the electrical current flow based on the polarity of the voltage source 505.

The resistance of the magnetic tunnel junction 50 increases as the single domain wall 128 is shifted more and more to the left by electrical current entering the bottom contact 105 (via the voltage source 505), because the domain 129 enlarges more and more as the single domain wall 128 moves left. Since the magnetic orientation of the domain 129 is antiparallel to the magnetic orientation of the magnetic reference layer 113, the resistance increases as the size of the domain 129 increases.

The resistance of the magnetic tunnel junction 50 decreases as the single domain wall 128 is shifted more and more to the right by electrical current entering the bottom contact 103 (via the voltage source 505), because the domain 127 enlarges more and more as the single domain wall 128 moves right. Since the magnetic orientation of the domain 127 is parallel to the magnetic orientation of the magnetic reference layer 113, the resistance decreases as the size of the domain 127 increases.

The domain wall nanowire magnetic tunnel junction (DWnMTJ) device 100 is configured to encode (and store) multiple bits by shifting the single domain wall 128 via electrical current pulses to achieve predetermined resistances for the magnetic tunnel junction 50. Each (predetermined) resistance may have a range of, e.g., 5 ohms (Ω) and still be designated the resistance. As such, each resistance is encoded as a state in the memory 525 (in FIG. 5). In one case, the domain wall nanowire magnetic tunnel junction (DWnMTJ) device 100 is configured to encode 7 bits; this requires 128 resistance states, where $2^7=128$. In general, to store N bits in the device, $2^N$ distinct resistance states are needed. Each bit can be logical high (1) or low (0) where (1) and (0) are distinct values of the resistance of the device, which correspond to distinct positions of the domain wall 128 along the length of the free layer in the DWnMTJ device 100.

Figure 2:
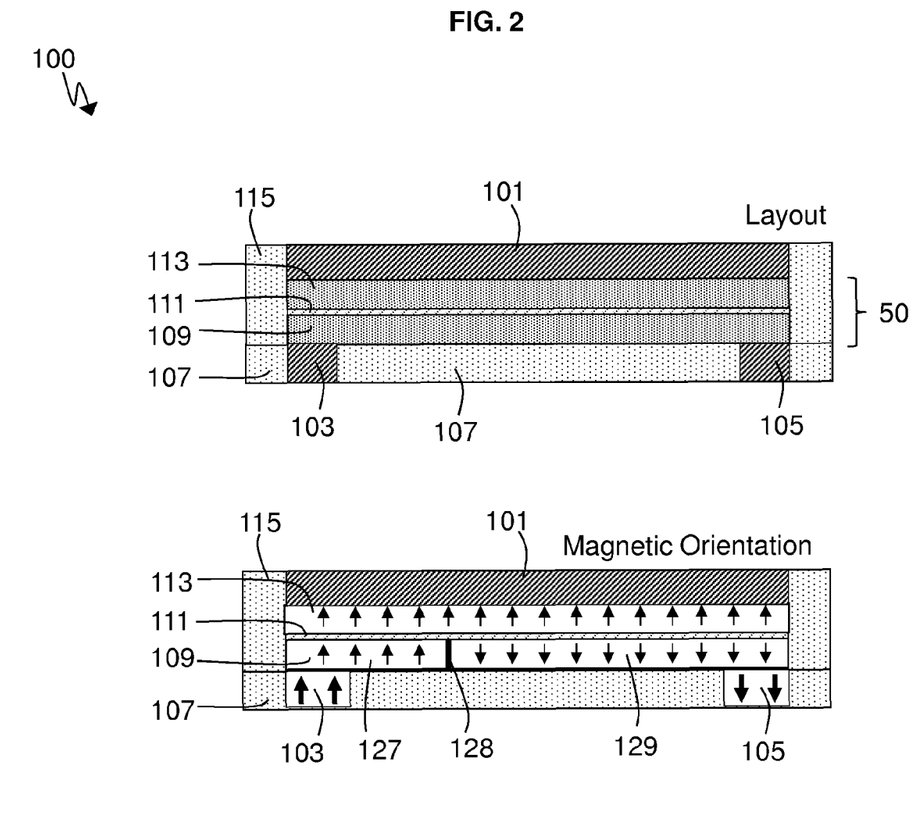
FIG. 2 is cross-sectional view of the domain wall nanowire magnetic tunnel junction device according to an embodiment.

FIG. 2 is cross-sectional view of domain wall nanowire magnetic tunnel junction (DWnMTJ) device 100 according to an embodiment. The device 100 includes all the features of FIG. 1, and additionally includes fixed magnetic layers in the bottom contacts 103 and 105. The fixed magnetic layer in the bottom contact 103 has a permanent magnetic orientation (e.g., pointing up) that is parallel to the magnetic reference layer 113. The fixed magnetic layer in the bottom contact 105 has a permanent magnetic orientation (e.g., pointing down) that is antiparallel to the magnetic reference layer 113.

The fixed magnetic layers in the bottom contacts 103 and 105 beneath the magnetic storage layer 109 ensure that the two respective domains 127 and 129 (of opposite magnetization separated by the single domain wall 128) are always present in the domain wall nanowire magnetic tunnel junction (DWnMTJ) device 100. The fixed magnetic layers in the bottom contacts 103 and 105 may be ferromagnetic or antiferromagnetic materials or a combination thereof to pin the respective opposite magnetic orientations of the two domains 127 and 129.

Figure 3:
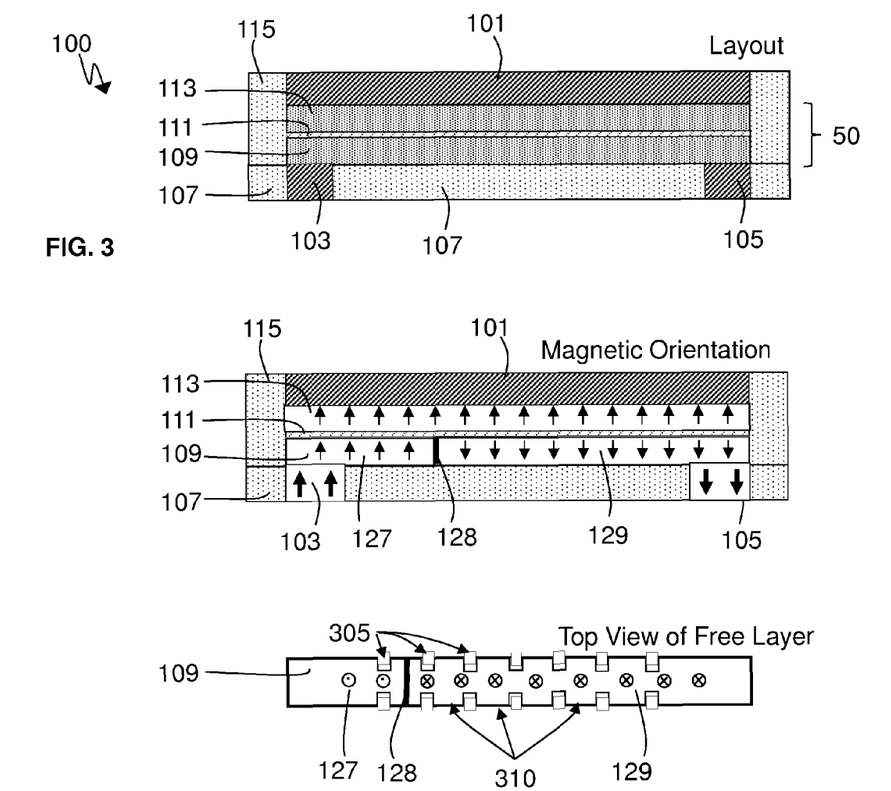
FIG. 3 is a cross-sectional view of the domain wall nanowire magnetic tunnel junction device and a top view of the magnetic storage layer according to an embodiment.
Figure 4:
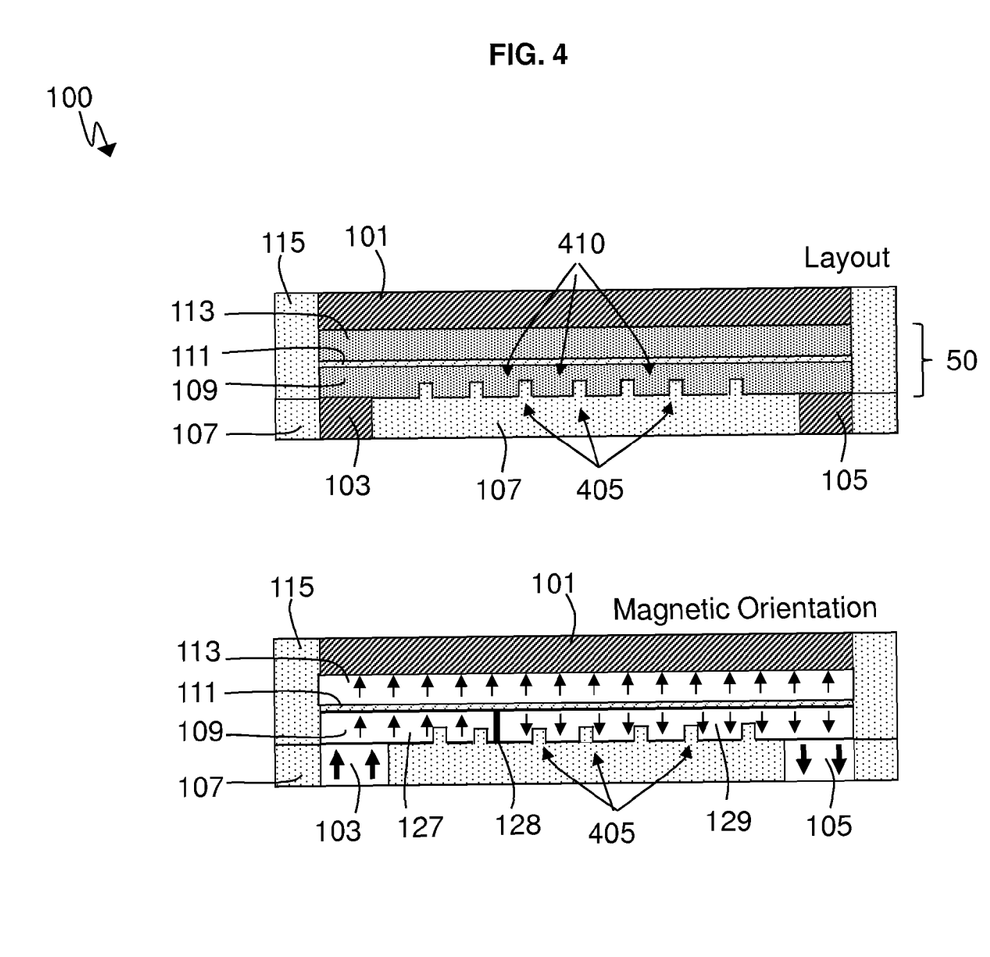
FIG. 4 is a cross-sectional view of the domain wall nanowire magnetic tunnel junction device according to an embodiment.

FIGS. 3 and 4 illustrate the domain wall nanowire magnetic tunnel junction (DWnMTJ) device 100 with structures to facilitate pinning of the single domain wall 128 in specific locations (where each location corresponds to a predetermined resistance value). The device 100 in FIGS. 3 and 4 include the features in FIGS. 1 and 2.

FIG. 3 is a cross-sectional view of the domain wall nanowire magnetic tunnel junction (DWnMTJ) device 100 and a top view of the magnetic storage layer 109 according to an embodiment. In FIG. 3, the magnetic storage layer 109 has notches 305 (pairs) on opposite sides, and the single domain wall 128 can be pinned in any desired location 310 (corresponding to a predetermined resistance) between notch pairs 305. The locations 310 are the spaces between each of the notch pairs 305 in which the single domain wall 128 can reside after being moved through the constriction between a pair of notches 305. The pair of notches 305 are etched/cut into the magnetic storage layer 109. The distance in between the opposing notches 305 may be (but is not required to be)

smaller than the single domain wall 128, such that the single domain wall 128 has to bend (or fold) to squeeze between the opposing notches 305.

In the top view of the magnetic storage layer 109, the circle with the "X" represents the arrows pointing away from the viewer (which are pointing down in the cross-sectional view), while the circle with the dot represents the arrows pointing at the viewer (which are pointing up in the cross-sectional view).

When electrical current enters the bottom contact 103 connected to the positive side of the voltage source 505 (and exits the bottom contact 105), the electrical current shifts the single domain wall 128 in one direction; here for example is illustrated motion to the right, the direction of the current (the motion can be in the current direction or opposite the current direction, depending on the materials used to fabricate the device 100), and the single domain wall 128 has to squeeze through the constriction between the pair of notches 305, which requires a preset amount of electrical current to fit (i.e., squeeze) between the pair of notches 305. The single domain wall 128 is stable once it reaches the location 310. As such, when shifting the single domain wall 128 (to the right or left), the preset amount of electrical current can be applied (by the voltage source 505) to squeeze the single domain wall 128 between the pair of opposing notches 305, thus being able to move the single domain wall 128 to discrete locations 310. By knowing in advance and applying the preset amount of electrical current to squeeze through a single pair of opposing notches 305, the single domain wall 128 can be moved one location 310 at a time (and/or multiple locations at a time) based on the preset amount applied electrical current. For example, to move the single domain wall 128 a certain number of locations 310 (e.g., through 3 pair of opposing notches 305 to a third location 310), a preset amount of electrical current can be applied by the voltage source 505 to reach the last location 310. Although moving the single domain wall 128 (through the pair of notches 305) to the right was explained in the above example, the same applies by analogy to move the single domain wall 128 to the left.

Similar to FIG. 3, FIG. 4 is a cross-sectional view of the domain wall nanowire magnetic tunnel junction (DWnMTJ) device 100 according to an embodiment. FIG. 3 illustrates side pinning of the single domain wall 128 while FIG. 4 illustrates bottom pinning.

FIG. 4 shows notches 405 on the bottom of the magnetic storage layer 109 to pin the single domain wall 128 at the locations 410 between the notches 405. The above discussion for FIG. 3 applies to FIG. 4 to move the single domain wall 128 to any of the discrete locations 410. As discussed above, the single domain wall 128 has to squeeze between a notch 405 to make it to the adjacent location 405, by applying the preset amount of electrical current that corresponds to squeezing through Z amount of notches 405 (305) (where Z is the desired amount of notches), to reach any state. The notches 305 and 405 ensure that the single wall domain 128 is moved to exact states for storing and encoding multiple bits, which corresponds to predetermined resistances.

FIG. 5 illustrates a memory device 500 which includes the circuit for an array of domain wall nanowire magnetic tunnel junction (DWnMTJ) devices 100. The memory device 500 (and the devices 100) is controlled by a memory controller which is a processing circuit 520 as understood by one skilled in the art. The processing circuit 520 controls the amount of electrical current and the direction of the electrical (whether entering the bottom contact 103 or the bottom contact 105), to achieve the predetermined resistance for encoding the bits. The processing circuit 520 may be an application specific integrated circuit (ASIC) for operating the array of domain wall nanowire magnetic tunnel junction (DWnMTJ) devices 100 as discussed herein. Also, the processing circuit 520 can execute instructions stored in memory 525 to operate the array of devices 100 as discussed herein. Each device 100 may be considered a memory cell, and the memory cells are connected in a grid as understood by one skilled in the art. The processing circuit 520 is configured to control writing to the device 100 as discussed herein by controlling the electrical current.

The memory device 500 includes and/or is operatively connected to one or more voltage sources 505 supplying voltage bias V to the circuit for the array of devices 100 as directed by the processing circuit 520 via multiplexers 515 for writing to the magnetic tunnel junction 50. The processing circuit 520 is configured to check/read a bit (or state) of the device 100 by measuring the resistance of the device 100 via the ohm meter 530. The processing circuit 520 utilizes an analog to digital converter 535 to convert the resistance value to a binary value for the encoded bit.

Figure 6:
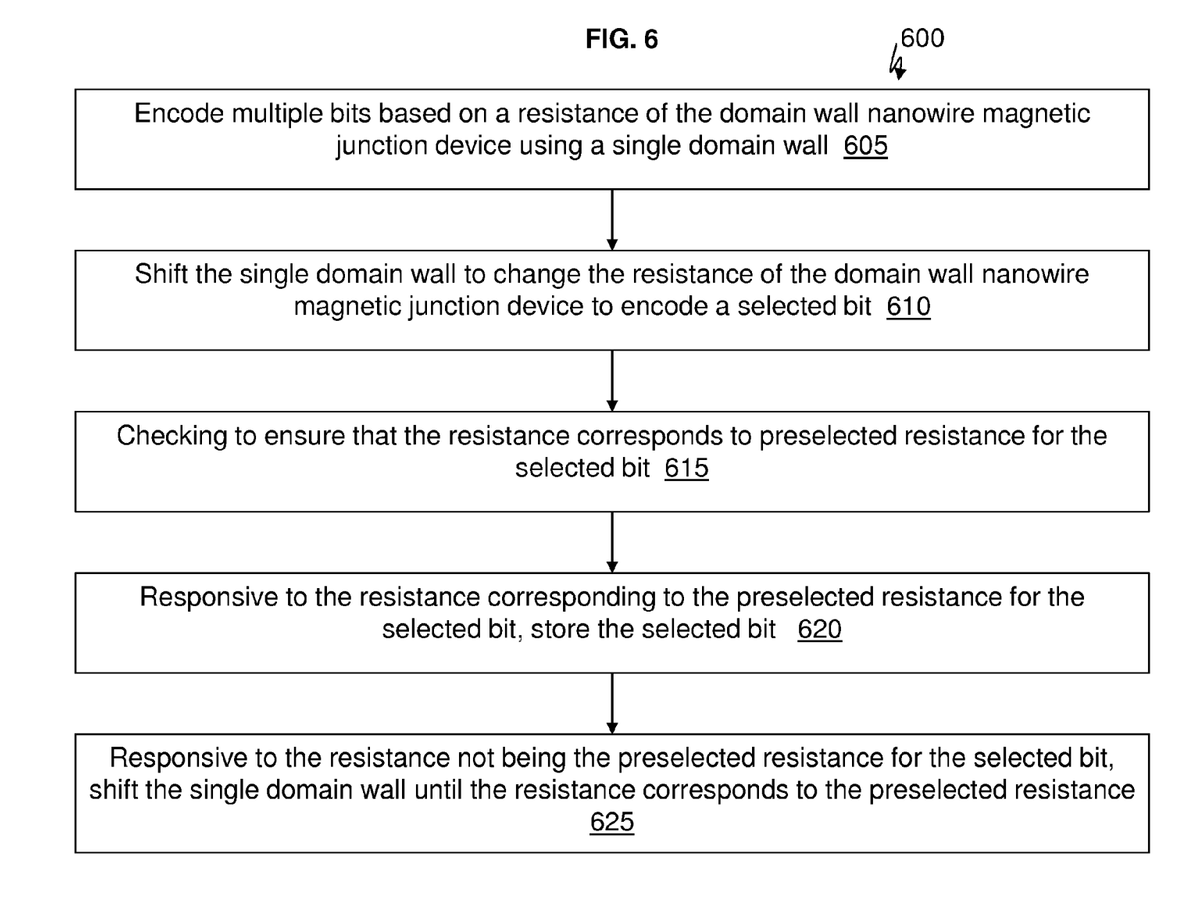
FIG. 6 is a method of encoding and storing multiple bits (e.g., multiple states corresponding to respective resistances) in the domain wall nanowire magnetic tunnel junction device via a single domain wall according to an embodiment.

FIG. 6 illustrates a method 600 of encoding and storing multiple bits (e.g., multiple states corresponding to respective resistances) in the domain wall nanowire magnetic tunnel junction (DWnMTJ) device 100 via the single domain wall 128 according to an embodiment. Reference can be made to FIGS. 1-5 and 7.

At block 605, the processing circuit 520 is configured to encode multiple bits based on a resistance of the domain wall nanowire magnetic junction device 100 using a single domain wall 128. For example, each resistance value (which may be a range from +/−5 ohms (or another amount)) may correspond to a digital value (such as a binary value), when converted by the analog to digital converter 535. The various resistance values and the bits that each resistance value corresponds to can be stored in the memory 535.

When writing to the device 100, the processing circuit 520 is configured to shift the single domain wall 128 to change the resistance of the domain wall nanowire magnetic junction device 100 to encode a selected bit at block 610.

In response to writing to the device 100 by shifting the single domain wall 128 to the resistance value to equal the preselected resistance (for the selected bit), the processing circuit 520 is configured to check to ensure that the resistance corresponds to the preselected resistance for the selected bit at block 615. For example, the processing circuit 520 may cause the voltage source 505 to apply electrical current of a predefined amount to shift the single domain wall 128 to a location that corresponds to the preselected resistance for the selected bit, when writing. Then, the processing circuit 520 checks the resistance (via the ohm meter 530) of the magnetic tunnel junction 50 to determined if the single domain wall 128 has been moved the precise amount to correspond to the preselected resistance needed for the selected bit.

At block 620, responsive to the resistance of the magnetic tunnel junction 50 corresponding to the preselected resistance for the selected bit, the processing circuit stores the selected bit. The processing circuit 520 may confirm that the selected bit is written in the device 100.

Responsive to the resistance not being the preselected resistance for the selected bit, the processing circuit 520 is configured to shift the single domain wall 128 again (via electrical current flowing into either the bottom contact 103 to move in one direction or into the bottom contact 105 to move in the other direction) until the resistance value equals the preselected resistance value at block 625. If the resistance of the magnetic tunnel junction 50 does not yet equal the preselected resistance, the processing circuit 520 continues to shifting and then checking the resistance of the magnetic tunnel junction 50 until the resistance equals (meets within the range) the preselected resistance for the selected bit. For when the resistance is too high, the processing circuit 520 moves the single domain wall 128 to the right and then checks, and when the resistance is too low, the processing circuit 520 moves the single domain wall 128 to the left and then checks.

The method may also include shifting the single domain wall 128 until all of the multiple bits are encoded by their respective preselected resistances of the domain wall nanowire magnetic junction device 100. Each of the preselected resistances corresponds to preselected ones of the multiple bits. Each of the preselected resistances (value) may be stored in the memory 525 along with its preselected ones of the multiple bits, such that a preselected resistance value has its own particular bit. This allows the processing circuit 520 to know what preselected resistance is needed to correspond to a particular encoded bit.

The method in which the resistance of the domain wall nanowire magnetic junction device 100 depends on a particular location of the single domain wall 128 along a nanowire. The length of the device 100 from left to right is considered a nanowire.

The method in which the resistance of the domain wall nanowire magnetic junction device 100 varies monotonically with a distance of the single domain wall 128 from either end of the domain wall nanowire magnetic junction device 100 to encode the multiple bits. The distance can be from the left end of the magnetic storage layer 109 and/or from the right end of the magnetic storage layer 109.

The method in which the domain wall nanowire magnetic junction device 100 is formed by three stacked thin film layers (e.g., the magnetic tunnel junction 50) comprising a magnetic storage layer 109, a nonmagnetic tunnel barrier 111, and a magnetic reference layer 113 (free layer).

The method in which the magnetic storage layer 109 comprises two magnetic domains (left domain 127 and right domain 129) oppositely magnetized and separated by the single domain wall 128. The single domain wall 128 is shifted in either direction (left or right) by passing electrical current through the magnetic storage layer along a long axis (left to right or right to left) of the domain wall nanowire magnetic junction device 100 in order to adjust a relative size of the two magnetic domains 127 and 129. When the left domain 127 increases in size, the right domain 129 decreases in size and the resistance decreases. When the right domain 129 increases in size, the left domain 127 decreases in size and the resistance increases.

The method in which a first fixed magnetic layer (e.g., in the bottom contact 103 in FIGS. 2, 3, and 4) and a second fixed magnetic layer (e.g., in the bottom contact 105 in FIGS. 2, 3, and 4) are located beneath either end of the magnetic storage layer 109. The first fixed magnetic layer pins a first (the left domain 127) of the two magnetic domains in a first magnetic orientation (e.g., parallel), while the second fixed magnetic layer pins a second (the right domain 129) of the two magnetic domains in a second magnetic orientation (e.g., antiparallel) opposite the first magnetic orientation.

The method includes shifting the single domain wall 128 to stop in one of a plurality of locations (such as the locations 310 and 410) beside one of a plurality of notches (such as the notches/indentations 305 and 405) formed in the magnetic storage layer 109, where the plurality of locations (locations 310 and 410) formed in the magnetic storage layer 109 correspond (one to one) to preselected resistances for encoding the multiple bits in the domain wall nanowire magnetic junction device 100.

Figure 7:
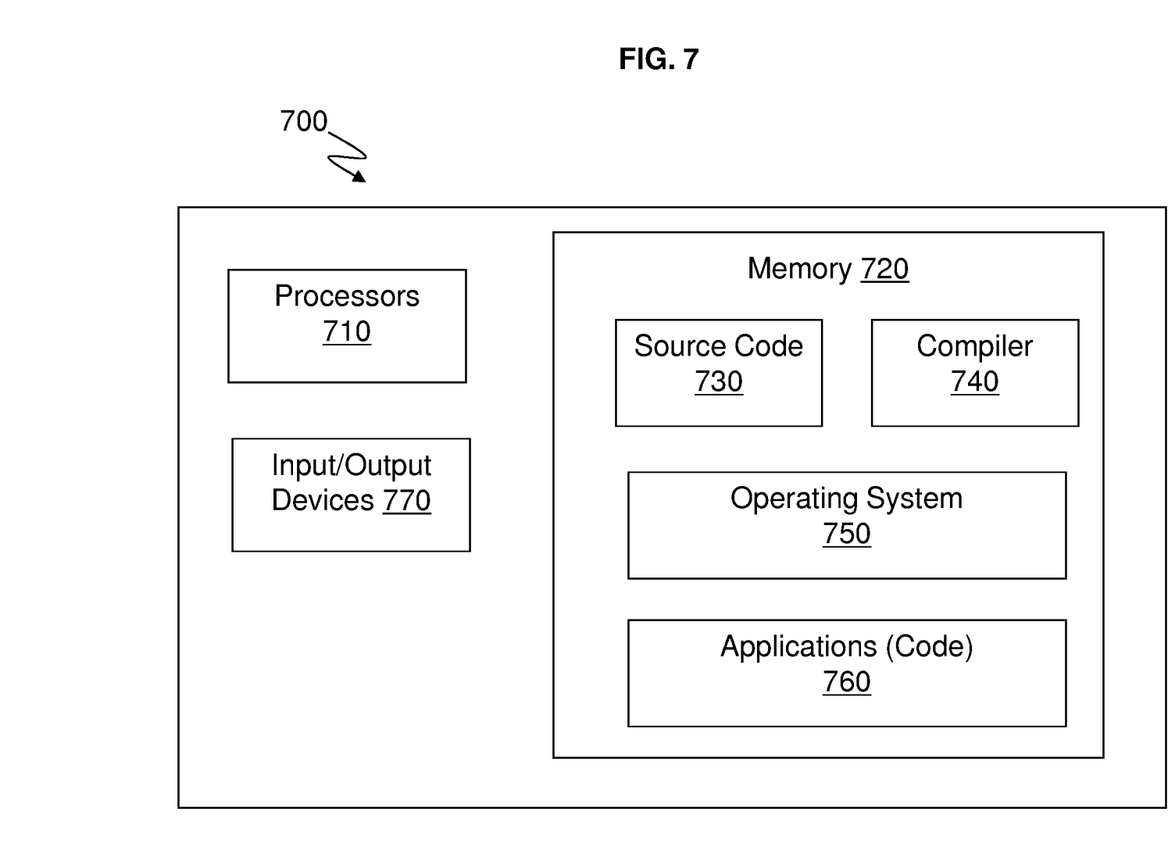
FIG. 7 illustrates an example of a computer which can be connected to, operate, and/or include the domain wall nanowire magnetic tunnel junction device according to an embodiment.

FIG. 7 illustrates an example of a computer 700 (which may include the memory device 500 having an array of devices 100 to operate the features discussed herein) having capabilities, which may be included in exemplary embodiments. Various methods, procedures, modules, flow diagrams, tools, applications, circuits, elements, equations, and techniques discussed herein may also incorporate and/or utilize the capabilities of the computer 700. Moreover, capabilities of the computer 700 may be utilized to implement features of exemplary embodiments discussed herein. One or more of the capabilities of the computer 700 may be utilized to implement, to incorporate, to connect to, and/or to support any element discussed herein (as understood by one skilled in the art) in FIGS. 1-6.

Generally, in terms of hardware architecture, the computer 700 may include one or more processors 710, computer readable storage memory 720, and one or more input and/or output (I/O) devices 770 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 710 is a hardware device for executing software that can be stored in the memory 720. The processor 710 can be virtually any custom made or commercially available processor, a central processing unit (CPU), a data signal processor (DSP), or an auxiliary processor among several processors associated with the computer 700, and the processor 710 may be a semiconductor based microprocessor (in the form of a microchip) or a microprocessor.

The computer readable memory 720 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 720 may incorporate electronic, magnetic, optical, and/or other types of storage media. Note that the memory 720 can have a distributed architecture, where various components are situated remote from one another, but can be accessed by the processor 710.

The software in the computer readable memory 720 may include one or more separate programs, each of which comprises an ordered listing of executable instructions for implementing logical functions. The software in the memory 720 includes a suitable operating system (0/S) 750, compiler 740, source code 730, and one or more applications 760 of the exemplary embodiments. As illustrated, the application 760 comprises numerous functional components for implementing the features, processes, methods, functions, and operations of the exemplary embodiments. The application 760 of the computer 700 may represent numerous applications, agents, software components, modules, interfaces, controllers, etc., as discussed herein but the application 760 is not meant to be a limitation.

The operating system 750 may control the execution of other computer programs, and provides scheduling, input-output control, file and data management, memory management, and communication control and related services.

The application 760 may be a source program, executable program (object code), script, or any other entity comprising a set of instructions to be performed. When a source program, then the program is usually translated via a compiler (such as the compiler 740), assembler, interpreter, or the like, which may or may not be included within the memory 720, so as to operate properly in connection with the O/S 750. Furthermore, the application 760 can be written as (a) an object oriented programming language, which has classes of data and methods, or (b) a procedure programming language, which has routines, subroutines, and/or functions.

The I/O devices 770 may include input devices (or peripherals) such as, for example but not limited to, a mouse, keyboard, scanner, microphone, camera, etc. Furthermore, the I/O devices 770 may also include output devices (or peripherals), for example but not limited to, a printer, display, etc. Finally, the I/O devices 770 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 770 also include components for communicating over various networks, such as the Internet or an intranet. The I/O devices 770 may be connected to and/or communicate with the processor 710 utilizing Bluetooth connections and cables (via, e.g., Universal Serial Bus (USB) ports, serial ports, parallel ports, FireWire, HDMI (High-Definition Multimedia Interface), etc.).

When the computer 700 is in operation, the processor 710 is configured to execute software stored within the memory 720, to communicate data to and from the memory 720, and to generally control operations of the computer 700 pursuant to the software. The application 760 and the O/S 750 are read, in whole or in part, by the processor 710, perhaps buffered within the processor 710, and then executed.

When the application 760 is implemented in software it should be noted that the application 760 can be stored on virtually any computer readable storage medium for use by or in connection with any computer related system or method.

The application 760 can be embodied in any computer-readable medium for use by or in connection with an instruction execution system, apparatus, server, or device, such as a computer-based system, processor-containing system, or other system that can fetch the instructions from the instruction execution system, apparatus, or device and execute the instructions.

In exemplary embodiments, where the application 760 is implemented in hardware, the application 760 can be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

It is understood that the computer 700 includes non-limiting examples of software and hardware components that may be included in various devices, servers, and systems discussed herein, and it is understood that additional software and hardware components may be included in the various devices and systems discussed in exemplary embodiments.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for storing multiple bits in a domain wall nanowire magnetic junction device, comprising:
    encoding the multiple bits based on a resistance of the domain wall nanowire magnetic junction device using a single domain wall;
    shifting the single domain wall to change the resistance of the domain wall nanowire magnetic junction device to encode a selected bit;
    checking to ensure that the resistance corresponds to a preselected resistance for the selected bit;
    responsive to the resistance corresponding to the preselected resistance for the selected bit, storing the selected bit; and
    responsive to the resistance not being the preselected resistance for the selected bit, shifting the single domain wall until the resistance corresponds to the preselected resistance;
    shifting the single domain wall to stop in one of a plurality of locations on either side of one of a plurality of notches formed in a magnetic storage layer but not at the one of the plurality of notches, the plurality of locations formed in the magnetic storage layer corresponding to preselected resistances for encoding the multiple bits in the domain wall nanowire magnetic junction device;
    wherein the plurality of notches correspond to a confined space in which the confined space constricts shifting of the single domain wall; and
    wherein the single domain wall bends in shape to pass through the confined space of any one of the plurality of notches.

2. The method of claim 1, further comprising shifting the single domain wall until all of the multiple bits are encoded by preselected resistances of the domain wall nanowire magnetic junction device;
    wherein each of the preselected resistances corresponds to preselected ones of the multiple bits.

3. The method of claim 1, wherein the resistance of the domain wall nanowire magnetic junction device depends on a location of the single domain wall along a nanowire.

4. The method of claim 1, wherein the resistance of the domain wall nanowire magnetic junction device varies monotonically with a distance of the single domain wall from either end of the domain wall nanowire magnetic junction device to encode the multiple bits.

5. The method of claim 1, wherein the domain wall nanowire magnetic junction device includes three stacked thin film layers comprising the magnetic storage layer, a nonmagnetic storage layer, and a magnetic reference layer.

6. The method of claim 5, wherein the magnetic storage layer comprises two magnetic domains oppositely magnetized and separated by the single domain wall;
   wherein the single domain wall is shifted in either direction by passing electrical current through the magnetic storage layer along a long axis of the domain wall nanowire magnetic junction device in order to adjust a relative size of the two magnetic domains.

7. The method of claim 6, wherein a first fixed magnetic layer and a second fixed magnetic layer are located beneath either end of the magnetic storage layer;
   wherein the first fixed magnetic layer pins a first of the two magnetic domains in a first magnetic orientation;
   wherein the second fixed magnetic layer pins a second of the two magnetic domains in a second magnetic orientation opposite the first magnetic orientation.

* * * * *